(12) United States Patent
Yueh et al.

(10) Patent No.: US 10,672,685 B2
(45) Date of Patent: Jun. 2, 2020

(54) DISPLAY DEVICE (71) Applicant: InnoLux Corporation, Miao-Li County (TW)

(72) Inventors: Jui-Jen Yueh, Miao-Li County (TW); Kuan-Feng Lee, Miao-Li County (TW); Yuan-Lin Wu, Miao-Li County (TW); Chandra Lius, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/804,259

(22) Filed: Nov. 6, 2017

(65) Prior Publication Data
US 2019/0004359 A1  Jan. 3, 2019

Related U.S. Application Data (60) Provisional application No. 62/539,579, filed on Aug. 1, 2017, provisional application No. 62/527,198, filed on Jun. 30, 2017.

(51) Int. Cl.
*H01L 23/48*       (2006.01)
*H01L 27/32*       (2006.01)
*G02F 1/1345*     (2006.01)
*G02F 1/1368*     (2006.01)
*G02F 1/1333*     (2006.01)
(Continued)

(52) U.S. Cl.
CPC .......... *H01L 23/481* (2013.01); *G02F 1/1339* (2013.01); *G02F 1/1368* (2013.01); *G02F 1/13306* (2013.01); *G02F 1/13452* (2013.01); *G02F 1/133345* (2013.01); *G02F 1/136227* (2013.01); *G02F 1/136286* (2013.01); *H01L 23/49827* (2013.01); *H01L 27/3276* (2013.01); *H01L 51/0096* (2013.01); *G02F 2202/16* (2013.01); *G02F 2202/28* (2013.01);
(Continued)

(58) Field of Classification Search
CPC ........... H01L 23/49827; H01L 27/3276; H01L 23/481; G02F 1/136227
See application file for complete search history.

(56) References Cited

U.S. PATENT DOCUMENTS

2011/0101313 A1* 5/2011 Hatcher ............... H01L 27/3246
257/40
2015/0279768 A1* 10/2015 Rathburn .......... H01L 23/49811
174/251
(Continued)

*Primary Examiner* — Laura M Menz
*Assistant Examiner* — Candice Chan
(74) *Attorney, Agent, or Firm* — Muncy, Geissler, Olds & Lowe, P.C.

(57) ABSTRACT

A display device is disclosed, which includes: a substrate having a first surface and a second surface, wherein the first surface is opposite to the second surface; a first conductive element disposed on the first surface; a second conductive element disposed on the second surface; and a connecting element disposed in a through via of the substrate, wherein the connecting element electrically connects the first conductive element and the second conductive element; wherein the second conductive element has a first oxygen atomic concentration, the connecting element has a second oxygen atomic concentration, and the first oxygen atomic concentration is greater than the second oxygen atomic concentration.

17 Claims, 4 Drawing Sheets

(51) Int. Cl.

| | | |
|---|---|---|
| | *G02F 1/1339* | (2006.01) |
| | *G02F 1/133* | (2006.01) |
| | *H01L 23/498* | (2006.01) |
| | *G02F 1/1362* | (2006.01) |
| | *H01L 51/00* | (2006.01) |
| | *H01L 51/52* | (2006.01) |
| | *H01L 27/15* | (2006.01) |
| | *H01L 33/48* | (2010.01) |

(52) U.S. Cl.
CPC .......... *H01L 27/156* (2013.01); *H01L 33/483* (2013.01); *H01L 51/5246* (2013.01)

(56) References Cited

U.S. PATENT DOCUMENTS

| | | |
|---|---|---|
| 2015/0370113 A1 | 12/2015 | Kim et al. |
| 2016/0021746 A1* | 1/2016 | Wright ................. G09G 3/3208 174/266 |
| 2016/0079337 A1 | 3/2016 | Mathew et al. |
| 2016/0124259 A1 | 5/2016 | Kawata |
| 2016/0133562 A1* | 5/2016 | Lee ........................ H01L 24/19 257/774 |
| 2016/0336532 A1 | 11/2016 | Li |

\* cited by examiner

DISPLAY DEVICE

CROSS REFERENCE TO RELATED APPLICATION

This application claims the benefit of filing date of U.S. Provisional Application Ser. No. 62/527,198, filed Jun. 30, 2017 under 35 USC § 119(e)(1)

BACKGROUND

1. Field

The present disclosure relates to a display device and, more particularly, to a display device with a narrow border region.

2. Description of Related Art

With the continuous advancement of technologies related to displays, all the display apparatuses are now developed toward compactness, thinness, and lightness. Therefore, cathode-ray-tube displays are replaced by thin displays as the mainstream display devices on the market. However, efforts are still needed, such as optimizing the circuit arrangement in the peripheral region, to achieve the purpose of forming a display device with a narrow border region.

SUMMARY

An object of the present disclosure is to provide a display device, wherein the display device has a narrow border region.

The present disclosure is related to a display device, which comprises: a substrate having a first surface and a second surface, wherein the first surface is opposite to the second surface; a first conductive element disposed on the first surface; a second conductive element disposed on the second surface; and a connecting element disposed in a through is of the substrate, wherein the connecting element electrically connects the first conductive element and the second conductive element; wherein the second conductive element has a first oxygen atomic concentration, the connecting element has a second oxygen atomic concentration, and the first oxygen atomic concentration is greater than the second oxygen atomic concentration.

In the display device of the present disclosure, when the second conductive element has higher oxygen atomic concentration, the higher antioxidant capacity of the second conductive element may result in better protection of the second conductive element or the connecting element from corrosion, and the display quality may be improved.

Other objects, advantages, and novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed element have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

In addition, the features in different embodiments of the present disclosure can be mixed to form another embodiment.

To achieve the purpose of forming a display device with a narrow border region, a through via may be formed in the substrate, a conductive material fills in the through via, and conductive elements at two sides of the substrate can be electrically connected through the conductive material filled in the through via. However, if the conductive elements (also called as contact pads) at two sides of the substrate do not have enough anti-oxidation properties, the conductive elements may be oxidized caused by the external environment. In this case, the conductive elements cannot be electrically connected well, and the efficiency of the display device may be deteriorated.

Hence, the present disclosure develops a display device, in which the conductive elements (also called as contact pads) at two sides of the substrate have enough anti-oxidation property; therefore, the deterioration of the efficiency of the narrow border display device can be prevented, and the lifetime of the narrow border display device can be elongated.

Embodiment 1

Figure 1:
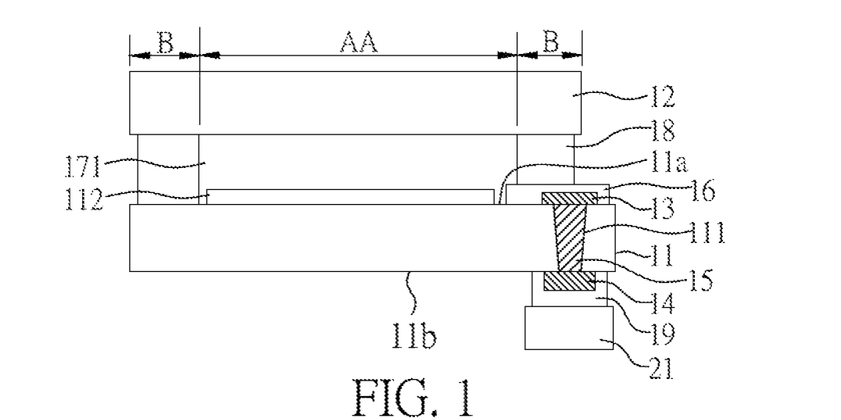
FIG. 1 is a cross sectional view showing a display device according to Embodiment 1 of the present disclosure.

FIG. 1 is a cross sectional view Showing a display device of the present disclosure. The display device of the present embodiment comprises: a substrate 11 having a first surface 11a and a second surface 11b, wherein the first surface 11a is opposite to the second surface 11b; a first conductive element 13 disposed on the first surface 11a; a second conductive element 14 disposed on the second surface 11b; and a connecting element 15 disposed in a through via 111 of the substrate 11, wherein the connecting element 15 electrically connects the first conductive element 13 and the second conductive element 14. Herein, a transistor array 112 is further disposed on the first surface 11a of the substrate 11.

The display device of the present embodiment is a liquid crystal display device. Hence, the display device of the present embodiment further comprises: a counter substrate 12 opposite to the substrate 11; and a liquid crystal layer 171 disposed between the substrate 11 and the counter substrate 12. However, in other embodiment of the present disclosure, the display medium layer disposed between the substrate 11 and the counter substrate 12 is not limited to the liquid crystal layer disclosed in the present embodiment, and can be a layer formed by other self-luminous or non-self-luminous display medium. For example, the display medium comprises, but is not limited to organic light-emitting diodes (OLEDs), quantum dots (QDs), fluorescence molecules, phosphors, light-emitting diodes (LEDs), micro light-emitting diodes (micro LEDs) or other display medium.

In addition, in the display device of the present embodiment, the substrate 11 and the counter substrate 12 can respectively be a glass substrate, a plastic substrate, other flexible substrates or films. When the substrate 11 and the counter substrate 12 are plastic substrates, flexible substrates or films, the display device of the present embodiment can be a flexible display device.

The display device of the present embodiment further comprises a driving unit 21 electrically connected to the second conductive element 14 through a conductive adhesive 19. Compared to the connecting element 15 embedded in the through via 111 of the substrate 11, the second conductive element 14 is disposed on the second surface 11b of the substrate 11 and electrically connects to the external driving unit 21. Hence, compared to the connecting element 15, the second conductive element 14 is arranged to have higher antioxidant capacity to reduce deterioration. Meanwhile, the probability of the oxidization or corrosion of the connecting element 15 can also be reduced.

The connecting element 15 in the through via 111 may be used to electrically connect with the first conductive element 13 and the second conductive element 14. In one embodiment, the through via 111 may be small and results in high resistance of the connecting element 15 in the through via 111. Herein, the material of the connecting element 15 may comprise a metal or an alloy with better conductivity, such as Cu, Ag, Au or alloy thereof, to reduce resistance or provide better electrical connection. The second conductive element 14 may be used for electrical connection or to protect the connecting element 15 from corrosion. Herein, the material of the second conductive element 14 may comprise a metal oxide layer with higher oxygen atomic concentration or better antioxidant capacity, such as ITO, IZO, ITZO, IGZO, AZO or a combination thereof. In one embodiment, the second conductive element 14 has a first oxygen atomic concentration, the connecting element 15 has a second oxygen atomic concentration, and the first oxygen atomic concentration is greater than the second oxygen atomic concentration. Herein, a ratio of the second oxygen atomic concentration of the connecting element 15 to the first oxygen atomic concentration of the second conductive element 14 is between 0.00001 and 0.5 (0.00001≤ratio≤0.5).

In addition, in the display device of the present embodiment, the first conductive element 13 may comprise a first metal, the connecting element 15 may comprise a second metal, and an oxidation potential of the first metal is greater than an oxidation potential of the second metal. In one embodiment, when the connecting element 15 is formed by, for example, Cu, Ag, Au or alloy thereof, the first conductive element 13 can be formed by metal or alloy with larger oxidation potential than the oxidation potential of Cu, Ag, Au or alloy thereof. For example, the first conductive element 13 can be formed by Al, Mo, Ti, In, Sn or alloy thereof but the present disclosure is not limited thereto. When the first metal comprised in the first conductive element 13 has higher oxidation potential, the probability of the oxidization or corrosion of the first conductive element 13 can be reduced and the probability of the connecting element 15 being oxidized may also be reduced. Herein, the first metal refers to the metal with the major content in the first conductive element 13, and second metal refers to the metal with the major content in the connecting element 15. In addition, if the first conductive element 13 and the connecting element 15 are multi-layered metal layers, the first metal and the second metal respectively refers to the metal with the major content comprised in the thickest metal layer of the multi-layered metal layer.

Furthermore, the display device of the present embodiment may further comprise an insulating layer 16 disposed on the first surface 11a. Herein, the insulating layer 16 is disposed on at least a part of the first conductive element 13. In the present embodiment, the insulating layer 16 covers the whole first conductive element 13 and the insulating layer 16 contacts the first conductive element 13. In other words, the insulating layer 16 overlaps with the first conductive element 13 in a viewing direction perpendicular to the substrate 11 (a top view). In addition, the display device of the present embodiment may further comprise a sealing layer 18 disposed on the first surface 11a and on a border region B of the substrate 11. Herein, the sealing layer 18 is disposed on at least a part of the first conductive element 13. The sealing layer 18 may contact the first conductive element 13. In the present embodiment, one part of the first conductive element 13 overlaps the sealing layer 18, and the other part of the first conductive element 13 does not overlap the sealing layer 18 in the viewing direction perpendicular to the substrate 11 (a top view). In addition, the sealing layer 18 is disposed on at least a part of the insulating layer 16. In the present embodiment, the whole sealing layer 18 is disposed on the insulating layer 16 and the sealing layer 18 contacts the insulating layer 16. Furthermore, the sealing layer 18 is disposed on at least a part of the connecting element 15. The insulating layer 16 and the first conductive element 13 are disposed between the sealing layer 18 and the connecting element 15. In the present embodiment, one part of the connecting element 15 overlaps the sealing layer 18 and the other part of the connecting element 15 does not overlap the sealing layer 18 in the viewing direction perpendicular to the substrate 11 (a top view). In the present disclosure, one element disposed on the other element includes the conditions of one element directly disposed on the other element, or one element indirectly disposed on the other element. In addition, one element overlapping the other element can be observed from a top view.

To achieve the purpose of narrow border regions of non-displaying area, the sealing layer 18 is disposed on the first conductive element 13. and the sealing layer 18 may cover the first conductive element 13. However, if the sealing layer 18 completely covers the first conductive element 13, the electrical properties of the first conductive element 13 may be deteriorated. If the sealing layer 18 does not cover the first conductive element 13, the border region of the display device may not be narrow. Hence, in the present embodiment, the sealing layer 18 mismatches the first conductive element 13. In other words, the sealing layer 18 partially overlaps the first conductive element 13 from a top view. More specifically, one part of the first conductive element 13 overlaps the sealing layer 18, and the other part of the first conductive element 13 does not overlap the sealing layer 18 in the viewing direction perpendicular to the substrate 11 (a top view). By this design, the purpose of narrow border regions can be achieved, or the electrical properties of the first conductive element 13 or the connecting element 15 are not greatly influenced. Compared with the sealing layer 18 completely covering the first conductive element 13 and the connecting element 15, the signal loading of the first conductive element 13 and the connecting element 15 can be reduced when the sealing layer 18 mismatches the first conductive element 13 and the connecting element 15.

In the present embodiment, the material for the insulating layer 16 is not particularly limited, and can be any insulating material, such as silicon oxide, silicon nitride, silicon ox nitride or a combination thereof. In addition, the material for the sealing layer 18 is not particularly limited, and can be any insulating material, such as resin or frit. However, the present disclosure is not limited thereto.

Figure 2A:
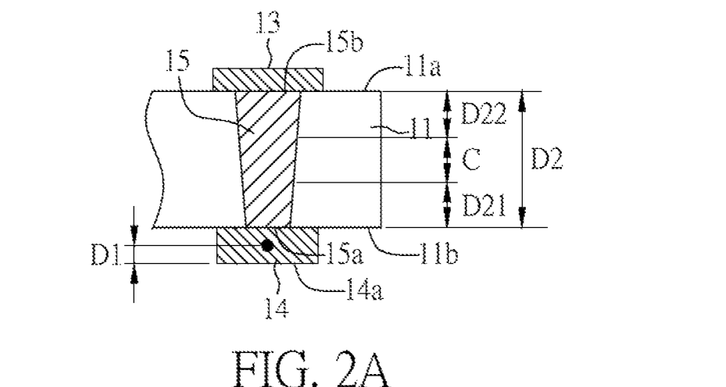
FIG. 2A is an enlarged view showing a connecting element in FIG. 1.

FIG. 2A is an enlarged view Showing the connecting element in FIG. 1. Measurement of the first oxygen atomic concentration of the second conductive element 14 and the second oxygen atomic concentration of the connecting element 15 is illustrated by FIG. 2A. In the present embodiment, the first oxygen atomic concentration may be measured at a depth D1 (from the surface 14$a$), which can be any depth greater than 0 nm and less than or equal to 10 nm (0 nm<D1≤10 nm). The second oxygen atomic concentration may be measured around a center region C of the connecting element 15. In one embodiment, the connecting element 15 has a length D2, a region D21 is a region from the surface 15$a$ to ⅓ of the length D2, a region D22 is a region from the surface 15$b$ to ⅓ of the length D2, and the center region C is between the region D21 and the region D22. The first oxygen atomic concentration of the second conductive element 14 and the second oxygen atomic concentration of the connecting element 15 can be measured by, for example, Scanning electron microscope/Energy dispersive spectrometer (SEM/EDS), Auger electron spectroscopy (AES), Electron spectroscopy for chemical analysis (ESCA) or Secondary-ion mass spectrometry (SIMS). According to the types of the measurement instrument used, the sample can be processed to a cross section such as shown in FIG. 2A to measure the first oxygen atomic concentration at the depth D1 or the second oxygen atomic concentration around the center region C. Alternatively, a depth analysis is processed from a surface, such as the surface 14$a$, to obtain the first oxygen atomic concentration around the depth D1 or the second oxygen atomic concentration around the center region C.

The aforementioned methods are only illustrated for reference and can be adjusted according to the used measurement instrument, as long as the connecting element 15 is measured based on its center C and the second conductive element 14 is measured based on its depth D1 (0 nm<D1≤10 nm).

Figure 2B:
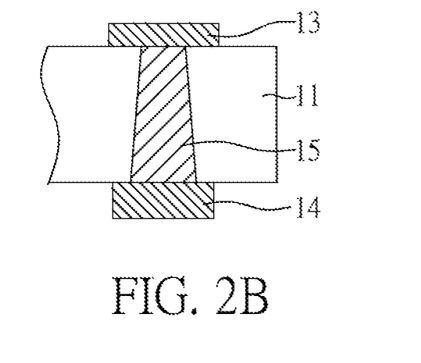
FIG. 2B and FIG. 2C are cross sectional views showing connecting elements according to other embodiments of the present disclosure.
Figure 2C:
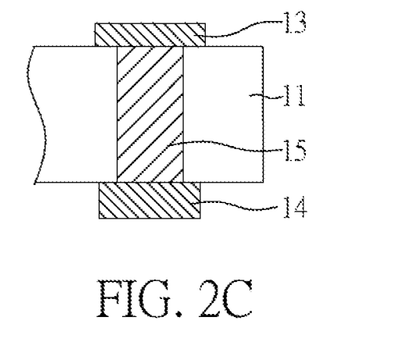

In FIG. 1 and FIG. 2A, the cross section of the connecting element 15 has an inverted trapezoidal shape. FIG. 2B and FIG. 2C are cross sectional views showing connecting elements according to other embodiments of the present disclosure. In FIG. 2B, the cross section of the connecting element 15 has a trapezoidal shape. In FIG. 2C, the cross section of the connecting element 15 has a rectangular shape. However, the present disclosure is not limited to, and the connecting element 15 may have an irregular shape or a curved shape.

Embodiment 2

Figure 3:
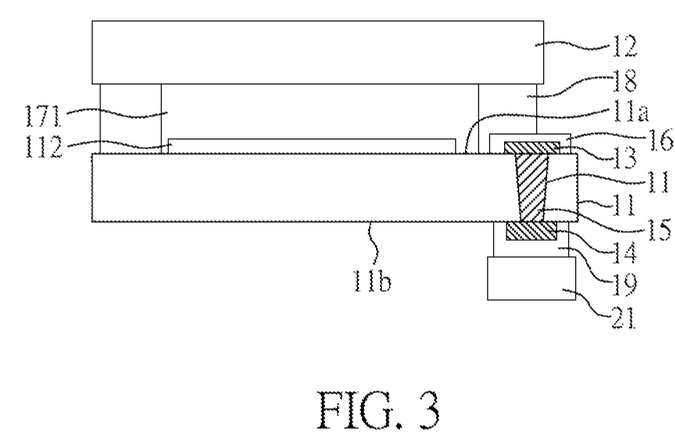
FIG. 3 is a cross sectional view showing a display device according to Embodiment 2 of the present disclosure.

FIG. 3 is a cross sectional view showing a display device of the present embodiment. The display device of the present embodiment is similar to that shown in Embodiment 1, except that the relative positions of the insulating layer 16 and the sealing layer 18 are different. In Embodiment 1, as shown in FIG. 1, the whole sealing layer 18 is disposed on the insulating layer 16. In other words, the insulating layer 16 is disposed between the sealing layer 18 and the substrate 11, and the sealing layer 18 does not contact the substrate 11 at this location. However, in the present embodiment, as shown in FIG. 3, only a part of the sealing layer 18 is disposed on the insulating layer 16 and a part of the sealing layer 18 may contact the substrate 11; but the present disclosure is not limited thereto.

Embodiment 3

Figure 4:
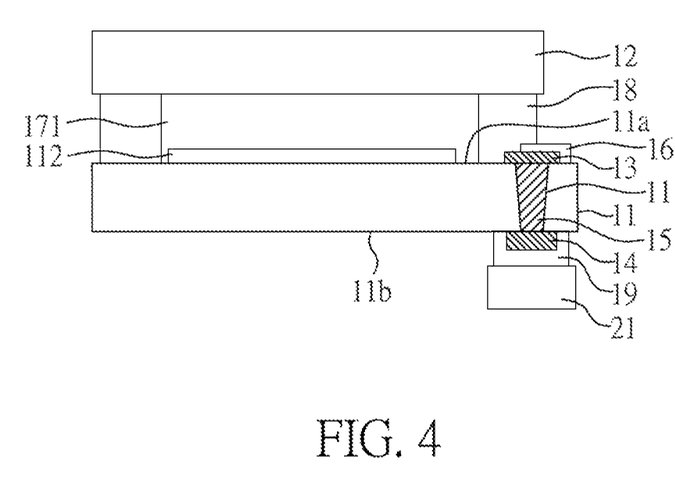
FIG. 4 is a cross sectional view showing a display device according to Embodiment 3 of the present disclosure.

FIG. 4 is a cross sectional view showing a display device of the present embodiment. The display device of the present embodiment is similar to that shown in Embodiment 1, except that the relative positions of the insulating layer 16, the sealing layer 18, the first conductive element 13 and the connecting element 15 are different. In Embodiment 1, as shown in FIG. 1, the insulating layer 16 covers the whole first conductive element 13 and contacts the first conductive element 13. However, in the present embodiment, as shown in FIG. 4, the insulating layer 16 covers a part of the first conductive element 13 or the sealing layer 18 covers a part of the first conductive element 13. In other words, the insulating layer 16 contacts the first conductive element 13 or the sealing layer 18 contacts the first conductive element 13. In the present embodiment, one part of the first conductive element 13 overlaps the insulating layer 16 or one part of the first conductive element 13 overlaps the sealing layer 18 in the viewing direction perpendicular to the substrate 11 (a top view). Hence, the insulating layer 16 mismatches both the first conductive element 13 and the connecting element 15 in the viewing direction perpendicular to the substrate 11 (a top view).

Embodiment 4

Figure 5:
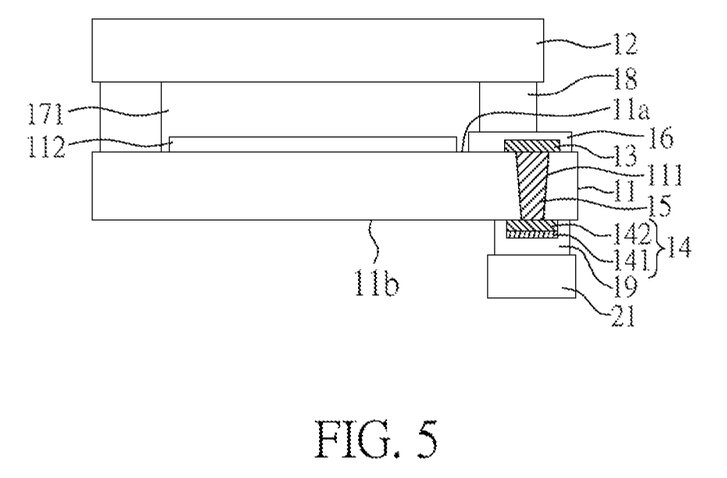
FIG. 5 is a cross sectional view showing a display device according to Embodiment 4 of the present disclosure.

FIG. 5 is a cross sectional view showing a display device of the present embodiment. The display device of the present embodiment is similar to that shown in Embodiment 1, except that second conductive elements 14 are different. In Embodiment 1, as shown in FIG. 1, the second conductive element 14 may have a single layer structure. However, in the present embodiment, as shown in FIG. 5, the second conductive element 14 may have a multilayer structure, which comprises a metal oxide layer 141 and a metal layer 142, and the metal layer 142 is disposed between the metal oxide layer 141 and the connecting element 15.

In the present embodiment, the material of the metal oxide layer 141 can be a metal oxide, such as ITO, IZO, ITZO, IGZO, AZO or a combination thereof. The thickness of the metal oxide layer 141 can be greater than or equal to 10 nm and less than 1000 nm (10 nm≤thickness<1000 nm). However, the present disclosure is not limited thereto. In addition, the connecting element 15 comprises a second metal, the metal layer 142 of the second conductive element 14 comprises a third metal, and an oxidation potential of the third metal is greater than an oxidation potential of the second metal of the connecting element 15. For example, when the material of the connecting element 15 is Cu, Ag, Au or an alloy thereof, the material of the metal layer 142 of the second conductive element 14 can be metal or alloy with an oxidation potential greater than Cu, Ag, Au or an alloy thereof, such as Al, Mo, Ti, In, Sn or an alloy thereof. However, the present disclosure is not limited to. When the oxidation potential of the third metal comprised in the metal layer 142 of the second conductive element 14 is greater than the oxidation potential of the second metal comprised in the connecting element 15, the probability of the oxidization or corrosion of the connecting element 15 can be reduced. Herein, the second metal refers to the metal with the major content comprised in the Connecting element 15, and the third Metal refers to the metal with the major content comprised in the metal layer 142 of the second conductive element 14. In addition, if the metal layer 142 of the second conductive element 14 is a multi-layered metal layer, the third metal refers to the metal with the major content comprised in the thickest metal layer of the multi-layered metal layer.

Embodiment 5

Figure 6:
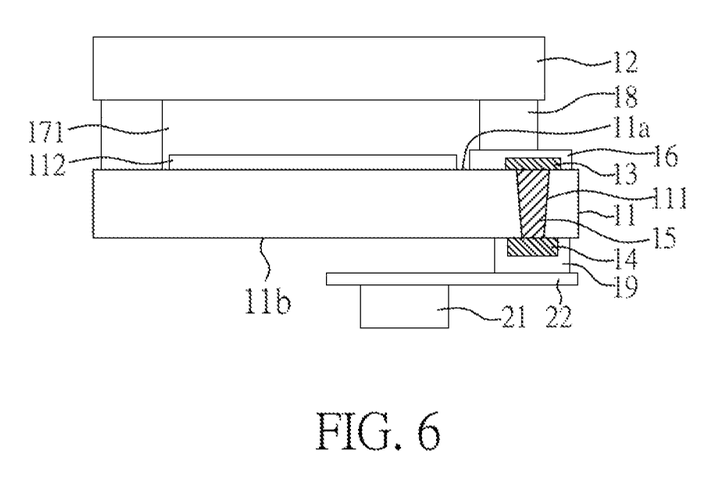
FIG. 6 is a cross sectional view showing a display device according to Embodiment 5 of the present disclosure.

FIG. 6 is a cross sectional view showing a display device of the present embodiment The display device of the present embodiment is similar to that shown in Embodiment 1, except that the positions of the driving units are different. In Embodiment 1, as shown in FIG. 1, the driving unit 21 is electrically connected to the second conductive element 14 through a conductive adhesive 19. However, in the present embodiment, as shown in FIG. 6, the display device may further comprise a printed circuit board 22, wherein the second conductive element 14 electrically connects to the printed circuit board 22 through the conductive adhesive 19, and the printed circuit board 22 electrically connects to the driving unit 21. In other words, the second conductive element 14 electrically connects to the driving unit 21 through the printed circuit board 22.

Embodiment 6

Figure 7:
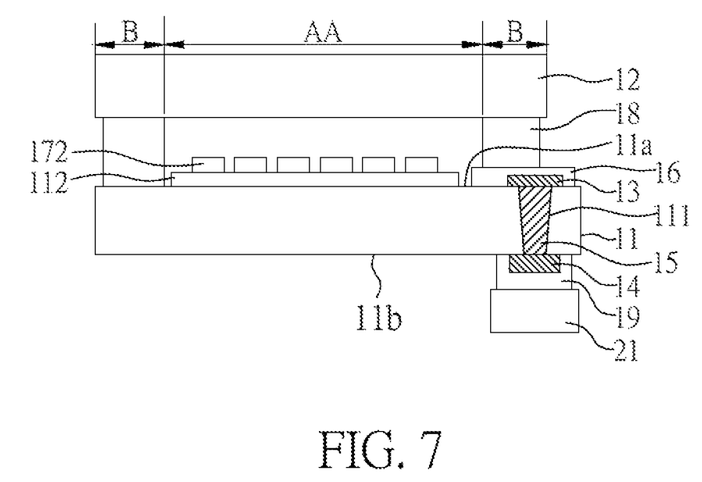
FIG. 7 is a cross sectional view showing a display device according to Embodiment 6 of the present disclosure.

FIG. 7 is a cross sectional view showing a display device of the present embodiment. The display device of the present embodiment is similar to that shown in Embodiment 1, except that the display mediums are different. In Embodiment 1, as shown in FIG. 1, the display medium is a liquid crystal layer 171. In the present embodiment, as shown in FIG. 7, the display medium is a self-luminous display medium 172, which may comprise OLEDs, QDs, LEDs, micro LEDs or other self-luminous display medium, but is not limited thereto. The transistor array 112 is disposed on the first surface 11a of the substrate 11 and electrically connects with the self-luminous display medium 172. The driving unit 21 may electrically connect to the transistor array 112 through the connecting element 15. Even though FIG. 7 does not show the connection between the transistor array 112 and the first conductive element 13, the transistor array 112 may electrically connect to the first conductive element 13 in other views of the display device of the present embodiment.

Embodiment 7

Figure 8:
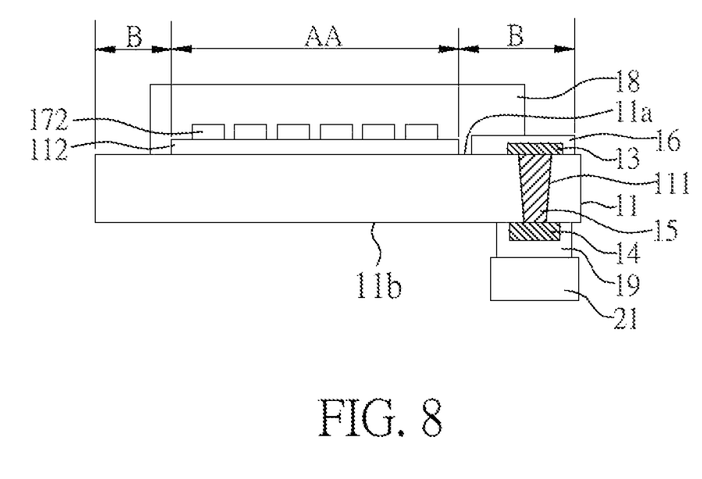
FIG. 8 is a cross sectional view showing a display device according to Embodiment 7 of the present disclosure.

FIG. 8 is a cross sectional view showing a display device of the present embodiment. The display device of the present embodiment is similar to that shown in Embodiment 6, except that dispositions of the sealing layer and the counter substrate. In Embodiment 6, as shown in FIG. 7, the display device comprise a counter substrate 12, and the sealing layer 18 is only disposed on the border region B. However, in the present embodiment, as shown in FIG. 8, the sealing layer 18 is further disposed on a display region AA of the substrate. In other words, the sealing layer 18 is disposed on not only the border region B but also the display region AA. Herein, the material of the sealing layer 18 is not particularly limited, and can be selected according to the display medium. In addition, in the display device of the present embodiment, no counter substrate is used. In the present embodiment, the display medium may comprise OLEDs, QDs, LEDs, micro LEDs or other display medium; but the present disclosure is not limited thereto. The display device of the present embodiment may be a curved display device, a flexible display device or a stretchable display device; but the present disclosure is not limited thereto.

The display device made as described in any of the embodiments of the present disclosure as described previously can be co-used with a touch panel to form a touch display device. Meanwhile, a display device or touch display device may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
    a substrate having a first surface and a second surface, wherein the first surface is opposite to the second surface;
    a transistor array disposed on the first surface;
    a first conductive element disposed on the first surface and comprising a first metal;
    a second conductive element disposed on the second surface; and
    a connecting element disposed in a through via of the substrate and comprising a second metal, wherein the connecting element electrically connects the first conductive element and the second conductive element;
    a sealing layer disposed on the a border region of the substrate;
    wherein the sealing layer is disposed on only a part of the first conductive element, and the other part of the first conductive element does not overlap the sealing layer;
    wherein the through via is disposed on the border region of the substrate;
    wherein the second conductive element has a first oxygen atomic concentration, the connecting element has a second oxygen atomic concentration, and the first oxygen atomic concentration is greater than the second oxygen atomic concentration;
    wherein an oxidation potential of the first metal is greater than an oxidation potential of the second metal;
    wherein, in a cross sectional view, the connecting element has at least two different widths.

2. The display device of claim 1, wherein a ratio of the second oxygen atomic concentration to the first oxygen atomic concentration is between 0.00001 and 0.5.

3. The display device of claim 1, wherein the connecting element comprises a metal or an alloy.

4. The display device of claim 1, wherein the second conductive element comprises a metal oxide layer.

5. The display device of claim 1, wherein the second conductive element comprises a metal layer and a metal oxide layer, and the metal layer is disposed between the metal oxide layer and the connecting element.

6. The display device of claim 5, wherein a thickness of the metal oxide layer is greater than or equal to 10 nm and less than 1000 nm.

7. The display device of claim 1, wherein the second conductive element comprises a third metal, and an oxidation potential of the third metal is greater than the oxidation potential of the second metal.

8. The display device of claim 1, further comprising an insulating layer disposed on the first surface, wherein the insulating layer is disposed on at least a part of the first conductive element.

9. The display device of claim 8, wherein the insulating layer contacts the first conductive element.

10. The display device of claim 1, wherein the sealing layer contacts the first conductive element.

11. The display device of claim 1, wherein the sealing layer is disposed on at least a part of an insulating layer disposed on the first surface.

12. The display device of claim 11, wherein the sealing layer contacts the insulating layer.

13. The display device of claim 1, wherein the sealing layer is disposed on at least a part of the connecting element.

14. The display device of claim 1, wherein the sealing layer is further disposed on a display region of the substrate.

15. The display device of claim 1, further comprising a driving unit electrically connected to the second conductive element through a conductive adhesive.

16. The display device of claim 15, further comprising a printed circuit board, wherein the second conductive element electrically connects to the printed circuit board through the conductive adhesive, and the printed circuit board electrically connects to the driving unit.

17. The display device of claim 15, wherein the driving unit electrically connects to the transistor array through the connecting element.

* * * * *